United States Patent [19]

Saito et al.

[11] 4,214,218

[45] Jul. 22, 1980

[54] IMPEDANCE MATCHED TUNING DEVICE HAVING IMAGE TRAPPING CIRCUIT

[75] Inventors: Mitsuo Saito; Mitsuo Makimoto; Sadahiko Yamashita, all of Kawasaki, Japan

[73] Assignee: Matsushita Electric Industrial Co., Ltd., Osaka, Japan

[21] Appl. No.: 15,601

[22] Filed: Feb. 27, 1979

[30] Foreign Application Priority Data

Feb. 28, 1978 [JP] Japan .................................. 53-22973

[51] Int. Cl.² ............................ H03J 3/00; H03J 5/00
[52] U.S. Cl. ........................................ 334/45; 334/41; 333/12; 333/230
[58] Field of Search ................ 333/25, 230, 235, 203, 333/207, 222, 223, 294, 246, 12, 238; 334/41, 42, 45, 85

[56] References Cited

U.S. PATENT DOCUMENTS 3,569,850  3/1971  Wegoner et al. ...................... 334/45

Primary Examiner—Alfred E. Smith
Assistant Examiner—Thomas P. O'Hare
Attorney, Agent, or Firm—Lowe, King, Price & Becker

[57] ABSTRACT

A tuning device including a conductive housing in which is suspended a dielectric substrate. A pair of first and second resonant circuits is disposed on the substrate in parallel with each other. Each resonant circuit is formed by an elongated conductive film and a capacitive element. An image frequency trapping circuit is arranged to intersect one of the transmission lines to absorb the signal at the image frequency. A grounded conductive strip film is provided adjacent to and parallel with each of the transmission lines and so spaced therefrom that the characteristic impedances of the transmission lines are made equal to each other.

3 Claims, 2 Drawing Figures

IMPEDANCE MATCHED TUNING DEVICE HAVING IMAGE TRAPPING CIRCUIT

FIELD OF THE INVENTION

The present invention relates to a tuning device for microwave frequencies having an image frequency trapping circuit.

BACKGROUND OF THE INVENTION

Conventional electronic tuning devices comprise a pair of identical resonant circuits disposed on a dielectric substrate, each resonant circuit including a conductive elongated film serving as a transmission line and a voltage-controlled capacitive element. The transmission lines of the resonant circuits are arranged in parallel to each other. Microwave energy is coupled with one of the resonant circuit and the tuned signal is then coupled with the other resonant circuit.

It is necessary however that the image interference ratio of the tuning device must be reduced to an acceptable level. An electronic tuning device as disclosed in Japanese Patent Application 50-151489 (laid open to public inspection on July 23, 1977 as Publication No. 52-75153) includes an image frequency trapping circuit which partially extends parallel with a pair of resonating transmission lines and partially extends at right angles crossing one of the transmission lines.

However, the cross-coupled transmission line undergoes a change in its characteristic impedance with a resultant discrepancy between the individual resonant frequencies of the two transmission lines, causing a tracking failure and waveform distortion.

SUMMARY OF THE INVENTION

An object of the invention is to provide a tuning device having an image frequency trapping circuit and a grounded conductive film provided adjacent to each transmission line, the grounded conductive film being so spaced with respect to the adjacent transmission line to vary its characteristic impedance that the two resonant circuits have equal resonant frequencies.

BRIEF DESCRIPTION OF THE DRAWINGS

The invention will be further described with reference to the accompanying drawings, in which.

DETAILED DESCRIPTION

Figure 1:
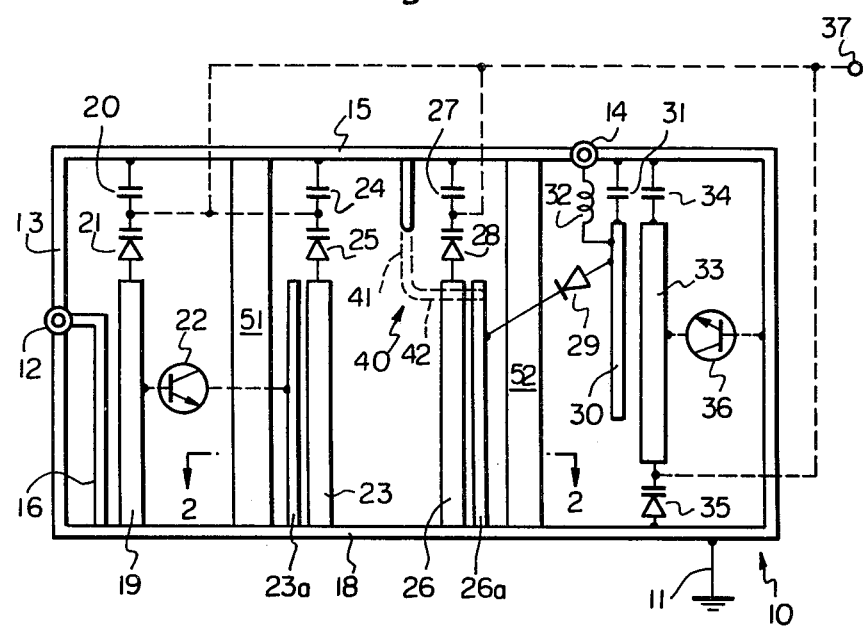
FIG. 1 is a plan view of the electronic tuning device of the invention.
Figure 2:
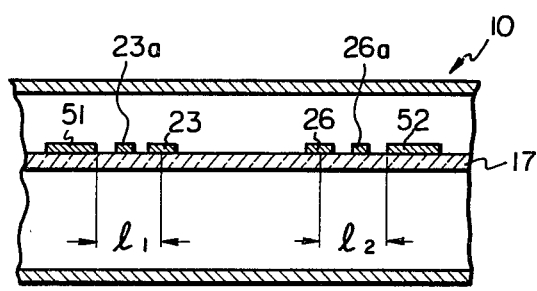
FIG. 2 is a cross-sectional view taken along the lines 2—2 of FIG. 1.

In FIG. 1, an electronic tuning device for ultrahigh frequencies is shown as comprising a conductive housing 10 which is connected to a ground potential as at 11 and provided with an input terminal 12 on an end wall 13 and an output terminal 14 on a side wall 15 of the housing. A coupling circuit formed by a conductive film strip 16 is provided on a 1.2 mm thick dielectric substrate 17 formed of glass epoxy, for example, which is suspended in the housing 10 as illustrated in FIG. 2, the film strip 16 being electrically connected at one end to the input terminal and at the other end to a side wall 18 which is at the ground potential and extending parallel to the end wall 13. In parallel with the conductive strip film 16 is disposed on the substrate 17 an input quarter-wave resonant circuit formed by a conductive film strip 19 which is connected at one end to the side wall 18 to serve as an inductive element and connected at the other end to the side wall 15 and a capacitive element formed by a capacitor 20 and a voltage-controlled capacitor or varactor 21. This allows injection of microwave energy from the input terminal 12 through the coupling element 16 and through the inductive element 19 into the housing 10. The transmission line 19 is connected to the control electrode of a transistor 22 for amplification of the injected microwave energy and application of the amplified energy to a coupling element 23a and thence to a first quarter-wave resonant circuit formed by a 2.0 mm wide, 14 mm long conductive film 23 serving as a transmission line, capacitor 24 and varactor 25 connected in the same manner as the input resonant circuit as described above.

In parallel with the transmission line 23 is disposed a second quarter-wave resonant circuit formed by transmission line 26 of the same dimensions as the film 23, capacitor 27 and varactor 28 in a series connection between the side walls 18 and 15. Adjacent to the transmission line 26 is provided a coupling element 26a which is connected by a mixer diode 29 to an inductive coupling element 30 of a local oscillator formed by a half-wave resonant circuit including elements 33, 34, 35, transistor 36, coil 32 and capacitor 31. The mixer output is coupled to the output terminal 14 through coil 32. The DC control terminals of the varactors 21, 25, 28 and 35 are all connected in common to a control terminal 37 to provide tuning.

An image frequency trapping circuit 40 is provided to trap the image frequency component of the tuned energy. This circuit comprises a first straight section 41 and a second straight section 42. The first section 41 extends in a direction parallel with the transmission line 26 and is connected at one end with the side wall 15. A part of the first section 41 is disposed on the upper side of the substrate 17 and the remainder is disposed underside of the substrate as shown in dotted lines. The second section 42 extends underside of the substrate 17 from the other end of the first section in a direction normal to the transmission line 26 to the coupling element 26a with which it is electrically connected, so that the section 42 intersects the transmission line 26. This image trapping circuit 40 has the effect of absorbing the microwave energy by 8 to 15 dB at the image frequency of the tuned signal with the resultant image interference ratio of about 48 dB to 55 dB.

The provision of the image trapping circuit 40 however results in the transmission line 26 having a characteristic impedance which differs from the characteristic impedance of the transmission line 23. As a result, the resonant frequency of the second resonant circuit deviates from the resonant frequency of the first resonant circuit, thereby causing a tracking failure and waveform distortion.

According to the invention, there is provided a first elongated film 51 which extends across the side walls 15 and 18 in parallel with, and adjacent to, the transmission line 23 remote from the transmission line 26. A second elongated film 52 of identical construction to the film 51 is disposed in parallel with, and adjacent to, the transmission line 26 remote from the transmission line 23. The film 51 is spaced from the center line of the conductor 23 a distance "$l_1$" and the film 52 is spaced from the center line of the conductor 26 a distance "$l_2$" as illustrated in FIG. 2. The films 51 and 52 have the effect of varying the characteristic impedances of the transmission lines 23 and 26, so that by suitably selecting the distance $l_1$ and $l_2$ the frequencies are made equal to each other. Typical values of $l_1$ and $l_2$ are 7.0 and 5.5 millimeters, respectively.

Since the characteristic impedance adjustment can be made simply by the provision of conductive thin films, the electronic tuning device of the invention permits the use of printed circuit technique for fabrication of the elements on the substrate 17, thereby eliminating the need to additionally provide discrete impedance compensating elements.

What is claimed is:

1. A microwave tuning device comprising:

a conductive housing;

a dielectric substrate supported in said housing;

a pair of first and second resonant circuits each including an elongated conductor to serve as an inductive transmission line and a voltage-controlled capacitive element connected to the transmission line in series between a pair of oppositely facing walls of said housing, the transmission lines of said resonant circuits being disposed on said substrate and arranged in parallel to each other;

an image frequency trapping circuit arranged to intersect the transmission line of one of said first and second resonant circuits for absorbing the microwave energy at the image frequency of the tuning device;

a first elongated conductor disposed on said substrate extending across said oppositely facing walls of said housing in parallel with, and adjacent to, the transmission line of said first resonant circuit remote from the transmission line of said second resonant circuit; and a second elongated conductor disposed on said substrate extending across said oppositely facing walls in parallel with, and adjacent to, the transmission line of said second resonant circuit remote from the transmission line of said first resonant circuit, said first and second conductors being spaced respective distances from the adjacent transmission lines to compensate for the difference between the characteristic impedances of said transmission lines resulting from the intersection of said image frequency trapping circuit with the transmission line of said one resonant circuit.

2. A microwave tuning device as claimed in claim 1, wherein said image frequency trapping circuit comprises a first section connected at one end and extending parallel with said transmission lines and a second section extending from said first section at right angles to said transmission line with which said first section intersects, said second section being disposed on the opposite side of said substrate to the side on which said first section is disposed.

3. A bandpass filter comprising:

a conductive housing;

a dielectric substrate supported in said housing;

a pair of first and second resonant circuits each including an elongated conductor to serve as a transmission line and a capacitive element connected to the transmission line in series between a pair of oppositely facing walls of said housing, the transmission lines of said resonant circuits being disposed on said substrate and arranged in parallel to each other;

an image frequency trapping circuit arranged to intersect the transmission line of one of said first and second resonant circuits for absorbing the microwave energy at the image frequency of the bandpass filter;

a first elongated conductor disposed on said substrate extending across said oppositely facing walls in parallel with, and adjacent to, the transmission line of said first resonant circuit; and a second elongated conductor disposed on said substrate extending across said oppositely facing walls in parallel with, and adjacent to, the transmission line of said second resonant circuit remote from the transmission line of said first resonant circuit, said first and second conductors being spaced respective distances from the adjacent transmission lines to compensate for the difference between the characteristic impedances of said transmission lines resulting from the intersection of said image frequency trapping circuit with the transmission line of said one resonant circuit.

* * * * *